United States Patent [19]

Hayashi

[11] Patent Number: 5,087,892
[45] Date of Patent: Feb. 11, 1992

[54] GAIN STABILIZING AMPLIFIER
[75] Inventor: Shigeo Hayashi, Kanagawa, Japan
[73] Assignee: Sumitomo electric Industries, Ltd., Osaka, Japan
[21] Appl. No.: 535,587
[22] Filed: Jun. 11, 1990
[51] Int. Cl.$^5$ ............................................... H03F 3/08
[52] U.S. Cl. .................................... 330/296; 330/308; 250/214 A
[58] Field of Search ......................... 330/59, 296, 308; 250/214 A

[56] References Cited
U.S. PATENT DOCUMENTS 3,872,392 3/1975 Sakamoto et al. .................. 330/290
4,122,403 10/1978 Cave .................................... 330/289

FOREIGN PATENT DOCUMENTS 0067448 12/1982 European Pat. Off. .
8755 1/1977 Japan .................................. 330/296
82804 3/1990 Japan ...................................... 330/59

OTHER PUBLICATIONS

Shunichi Nezu, "Bias Circuit", Patent Abstract of Japan, Jul. 13, 1977, vol. 1, No. 72 (E-77)(696).
Kouichi Itou, "Amplifier Circuit", Patent Abstract of Japan, Jul. 22, 1978, vol. 2, No. 90(E-78)(4133).
Davidson et al., "Bias Stabilization for Amplifier", *IBM Technical Disclosure Bulletin*, vol. 14, No. 2, Jul. 1971, p. 454.

Primary Examiner—James B. Mullins
Attorney, Agent, or Firm—Cushman, Darby & Cushman

[57] ABSTRACT

A gain stabilizing amplifier comprises an amplifying transistor for amplifying an input signal; a node for determining a current flowing into the amplifying transistor; a variable current supply connected to the node, a current output from the variable current supply being set to offset variations in a bias current of the amplifying transistor.

7 Claims, 5 Drawing Sheets

GAIN STABILIZING AMPLIFIER

BACKGROUND OF THE INVENTION

1. Field of the Invention

This invention relates to a gain stabilizing amplifier using a transistor.

2. Description of the Related Art

To stabilize the gain of an amplifier in response to power supply variations and environmental changes, techniques of providing a circuit such as (1) a feedback circuit; and (2) a constant voltage power circuit have heretofore been employed.

However, the technique (1) above presents the problem of not being suitable for use in high impedance amplifiers because the input impedance of the amplifier is reduced.

On the other hand, the above technique (2) has a shortcoming that the power supply voltage which is applied effectively to the amplifier circuit is decreased. For example, in an amplifier to which a voltage of +5 V is externally supplied, a built-in power supply circuit reduces that voltage to stabilize it. Therefore, the voltage actually applied to the amplifying transistor is about +4 V. In order to avoid such a voltage drop, a booster circuit is required, and this increases the size of the circuit a great extent.

SUMMARY OF THE INVENTION

In view of the above problems, an object of the present invention is to provide an amplifier capable of stabilizing its gain without causing negative effects on the characteristics inherent in the amplifier such as input impedance reduction nor complicating the circuit configuration.

To achieve the above object, the present invention provides, in an amplifier using a transistor, a gain stabilizing amplifier wherein a variable current supply is connected to a node for determining a bias current flowing through an amplifying transistor. Output current of the variable current supply is adjusted so that bias current variations of the amplifying transistor will be offset.

According to the present invention, in order to maintain the potential of a node that serves to determine a bias current flowing into the amplifying transistor at a prescribed value even in the case where the bias current value is varied with power supply variations and external environmental changes and as a result the gain is induced to change, a current supply is connected to the node, thereby reducing the bias current variation.

DETAILED DESCRIPTION OF THE PREFERRED EMBODIMENTS

The present invention will be described in detail with reference to embodiments.

Figure 1A:
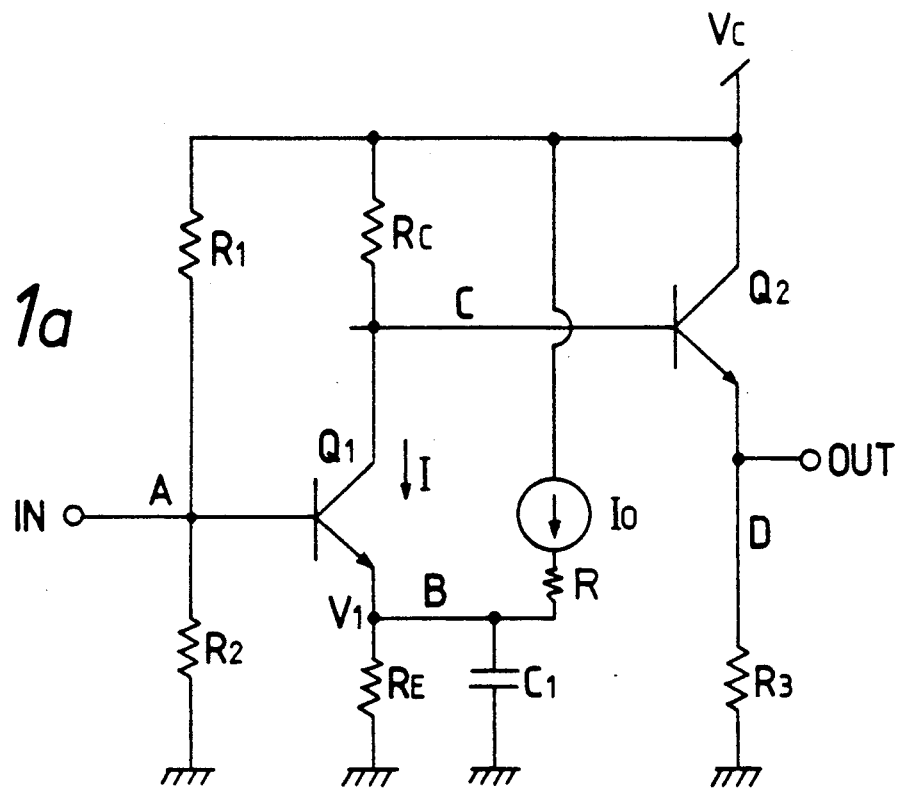
FIGS. 1a and 1b are circuit diagram showing a first embodiment of the present invention.

FIG. 1a is a circuit diagram showing a first embodiment of the present invention. In this embodiment a variable current supply $I_o$ is connected to the emitter of a transistor $Q_1$ constituting a conventional transistor amplifier, so that a potential at the emitter is maintained constant. It is assumed that the variable current supply $I_o$ exhibits the output characteristic shown in FIG. 2.

In FIG. 1a, a node A connected to an input terminal IN is biased by being connected to a power supply $V_c$ through a resistor $R_1$ and to the ground through a resistor $R_2$, respectively. Further, the node A is connected to the base of an amplifying transistor $Q_1$. A node C of the collector of the transistor $Q_1$ is not only connected to the power supply $V_c$ through a resistor $R_c$ but also to the base of the transistor $Q_2$. The collector of the transistor $Q_2$ is also connected to the power supply $V_c$, and a node D of its emitter is grounded through an output terminal OUT and a resistor $R_3$. A node B of the emitter of $Q_1$ is grounded through a resistor $R_E$. A capacitor $C_1$ is inserted between the node B and the ground, while the current supply $I_o$ is provided between the node B and the power supply $V_c$. this embodiment, the bias current I flowing through the amplifying transistor $Q_1$ is determined by a voltage $V_1$ of the node B, the resistor $R_E$, and the current supply $I_o$ and is given by the following equation.

$$I = \frac{V_1}{R_E} - I_o$$

$$V_1 = \frac{R_2}{R_1 + R_2} V_c - V_{BE}$$

The amplifier of this type receives only an AC signal admitted through a capacitor at its input. The AC signal applied to the node A is subjected to voltage amplification by the transistor Q1, and then transmitted to the output terminal with the transistor Q2 as an output buffer.

An operation of the embodiment shown in FIG. 1 will now be described.

Figure 2:
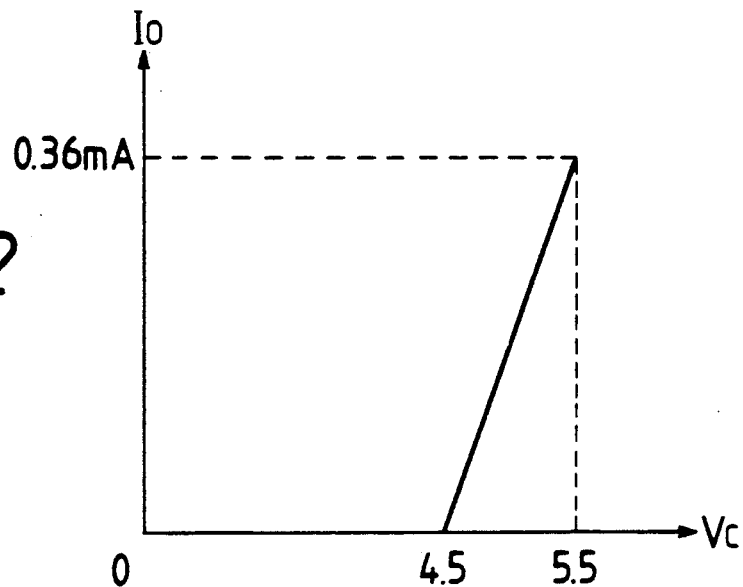
FIG. 2 is a diagram showing the output characteristic of a current supply $I_o$ shown in FIG. 1.

If there is no current supply $I_o$, a gain A is determined by a bias current I that flows through a transistor $Q_1$, and it is expressed as follows.

$$A = \frac{e}{kT} \cdot \frac{R_C}{R_E} \cdot \left( \frac{R_2}{R_1 + R_2} \cdot V_C - V_{BE} \right) \quad (1)$$

where e is the elementary electric charge; k is the Boltzmann constant; and $V_{BE}$ is the base-to-emitter voltage. In the above equation (1), if it is assumed $V_c$ (power supply voltage)=5 V, $R_1$=32 KΩ, $R_2$=18 KΩ, $V_{BE}$=0.8 V, $R_E$=1 KΩ, and $R_c$=1 KΩ, then the gain A varies from 45 to 31.5 with respect to a $V_c$ variation of ±0.5 V. (i.e. 4.5 V to 5.5 V). However, if the current supply $I_o$ varies as shown in FIG. 2, the gain does not vary with the varying $V_c$.

This means that the gain is determined by the bias current I flowing through the transistor $Q_1$. However, if there is no current supply $I_o$, the gain is determined by the potential $V_1$ at the emitter of the transistor $Q_1$, since $V_1$ is affected by $V_c$ variations. Thus, if the current supply $I_o$ is connected to the emitter as in the case of this embodiment, $I_o$ serves to compensate for the bias current I flowing through the transistor Q1 determined by $V_1$, thereby causing no gain variations with respect to variations of the power supply voltage $V_c$.

Figure 1B:
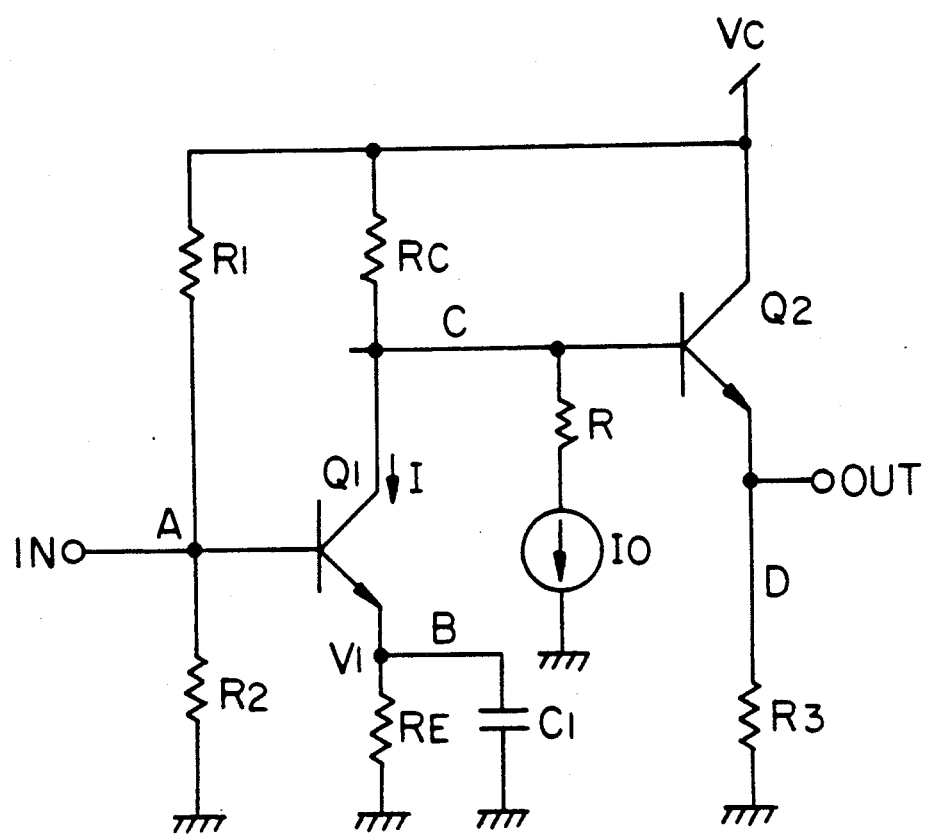
Figure 3:
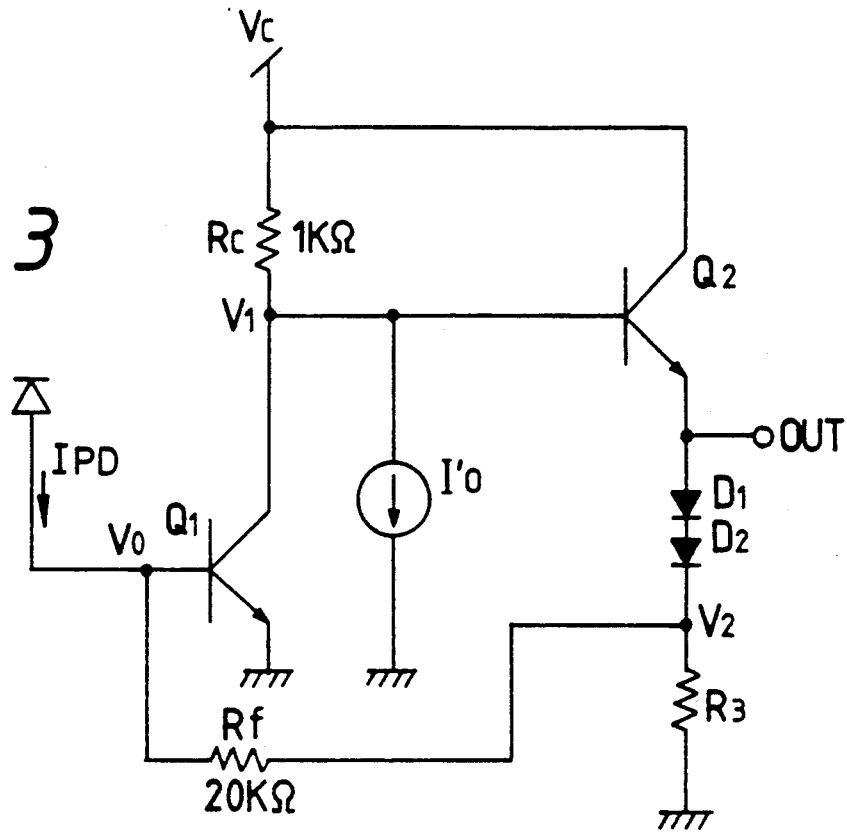
FIG. 3 is a circuit diagram showing a second embodiment of the present invention.

In the embodiment shown in FIG. 1, the bias current I flowing through the transistor $Q_1$ is determined by the potential at the emitter, so that the current supply $I_o$ is connected to the emitter. However, if the bias current I is determined by the collector voltage as shown in FIG. 3, the current supply may be connected to the collector as shown in FIG. 1b. The same applies to FETs.

Now, since the output impedance of the current supply is very high, there will be no detrimental effects to ac operations. If the capacitance of the current supply affects the amplifier circuit characteristics, a R may be inserted between the node determining the bias current of the amplifying transistor and the current supply.

The current supply $I_o$ or $I_o'$ can set the gain of the transistor so that not only the power supply voltage variations but also temperature variations may be compensated for, thereby allowing an amplifier having predetermined gains within a wide range to be provided.

Another embodiment will be described referring to FIGS. 3 and 4.

FIG. 3 shows a photodetection preamplifier. The anode of a photodiode, whose cathode is biased, is connected to the base of an amplifying transistor $Q_1$ and the emitter of $Q_1$ is grounded. The collector of $Q_1$ is connected to the base of an output transistor $Q_2$ and to a current supply $I_o'$, and further to a power supply $V_c$ through a resistor $R_c$. The collector of $Q_2$ is connected to the power supply $V_c$ and its emitter to an output terminal. Further, the emitter of $Q_2$ is connected to level shift diodes $D_1$ and $D_2$, one output of which is grounded through a resistor $R_3$ and the other connected to the base of $Q_1$ through a feedback resistor $R_f$. The bandwidth $f_c$ of this preamplifier can be given as follows.

$$f_c = \frac{A+1}{2\pi R C}$$

where
A: gain
R: $R_f // \{A \times (Q_1 \text{ input resistance})\}$
C: total capacitance at the base node of $Q_1$ $$A = \frac{1}{v_T} \{V_c - 4V_{BE} - R_c \cdot I_o'\}$$

$V_{BE}$: voltage between the base and emitter of the transistor

Since redundant bandwidth contributes only to increasing noise, the following relationship must be satisfied to make $f_c$ constant when $V_c = 5.0 \pm 0.5$ V.

$$I_o' = \frac{V_c - 4.5 \text{ V}}{R_c}$$

Figure 4:
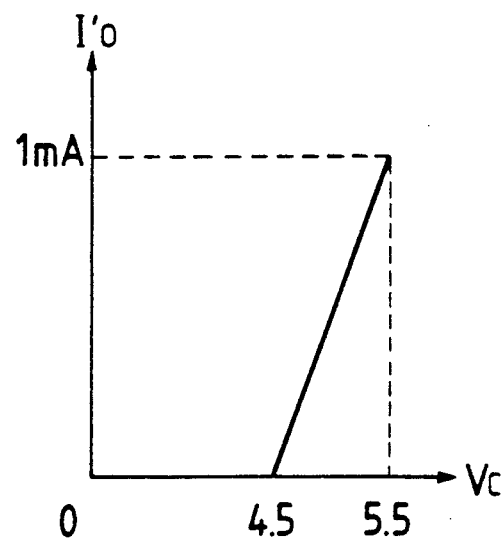
FIG. 4 is a diagram showing the output characteristic of a current supply $I_o'$, shown in FIG. 3.

If $R_c = 1$ KΩ, the solution is what is obtained by FIG. 4. Hence, the gain is given by $$A = \frac{4.5 - 4 V_{BE}}{v_T}$$

If $V_{BE} = 0.8$ V and $v_T = 26$ mV, then A = 34 dB.

Figure 5:
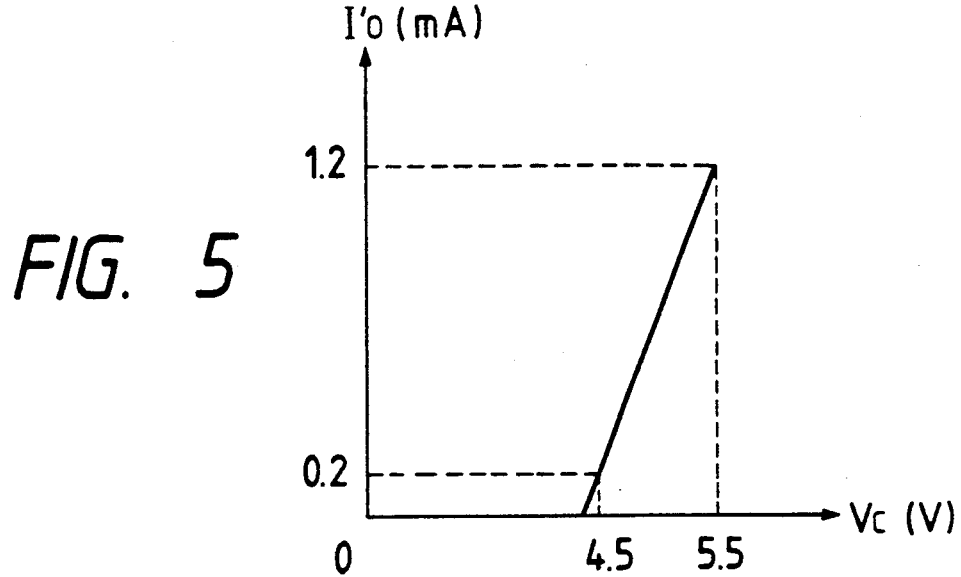
FIG. 5 is a diagram showing the output characteristic of a current supply according to an applied case of this invention.

Further, an applied case of this circuit provides an advantage that the gain can be reduced stably. For example, if it is intended that the target gain is 32.5 dB, then $I_o'$ is increased by 0.2 mA when $V_c$ is between 4.5 and 5.5 V as shown in FIG. 5. As a result, $$A = \frac{4.3 - 4 V_{BE}}{v_T}$$

If $V_{BE} = 0.8$ V and $v_T = 26$ mV, and A is stabilized at 32.5 dB.

Although the above describes only the $V_c$ variations, actually the resistor $R_c$, and voltage $v_T$ and $V_{BE}$ have temperature characteristics. Therefore, $I_o'$ should be adjusted in consideration of these factors.

The gain can be stabilized not only at a predetermined value but also according to an aimed characteristic. For example, if the target characteristic of an amplifier is 32 dB with $V_c = 5.5$ V, T = 0° C. or 32.5 dB with $V_c = 4.5$ V, T = 70° C. in relation to the downstream circuits, $I_o$ should be adjusted so that these conditions can be satisfied.

Accordingly, this system can freely adjust the gain isolating itself from or according to external variations (temperature, power supply voltage, or the like). To operate the system adjustments are needed to dc circuits only; devices admitting ac signals can be left intact. Thus, it is also possible to externally control the gain of an amplifier.

The operation of the circuit shown in FIG. 3 will be described.

The photodiode produces a photoelectric current $I_{PD}$ according to a light signal. In FIG. 3, if the ac component of a potential at the base of $Q_1$ is $v_o$, the ac component of $v_2$ is $V_2$, and the ac component of the output terminal is $v_{out}$ with the voltage gain of the amplifier stage being A, therefore $$v_{out} = v_2$$

$$\frac{v_2}{v_0} = -A$$

$$A = \frac{v_0}{R_{in}} \quad \frac{v_0 - v_2}{R_f} + i\omega C v_0$$

From the above equation, $$\frac{v_{out}}{I_{PD}} = \frac{-A}{\frac{1}{R_{in}} + \frac{A+1}{R_f} + i\omega C}$$

That is, the input resistance $R_{in}$ and the feedback resistor $R_f$ are used as the detection resistors for current-voltage conversion. Thus, the photocurrent $I_{PD}$ is converted to the voltage signal $v_{out}$. If the gain A and the input resistance $R_{in}$ are sufficiently large, the conversion gain Z will be as follows.

$$Z \sim \frac{A}{A+1} R_f \text{(Unit: Ω)}$$

In particular, the circuit shown in FIG. 3 is suitable for a photodetection preamplifier for the following reason.

The response bandwidth of the photodetection preamplifier is proportional to the gain, so that no signal can be transmitted if the bandwidth is too the bandwidth is narrow; and if too wide, the response will be deteriorated by increased noise. As a result, if there is no current supply $I_o'$ as shown in FIG. 3, the gain varies to a great extent responsive to a variation of $V_c = +5$ V$\pm$0.5 V with a resultant bandwidth deviation of $-31\%$ to $+91\%$ from the set point. However, if the current supply $I_o'$ is provided, the bandwidth can be maintained constant.

The photodetection preamplifier will hereunder be described in comparison with a conventional power supply regulating system.

Figure 6:
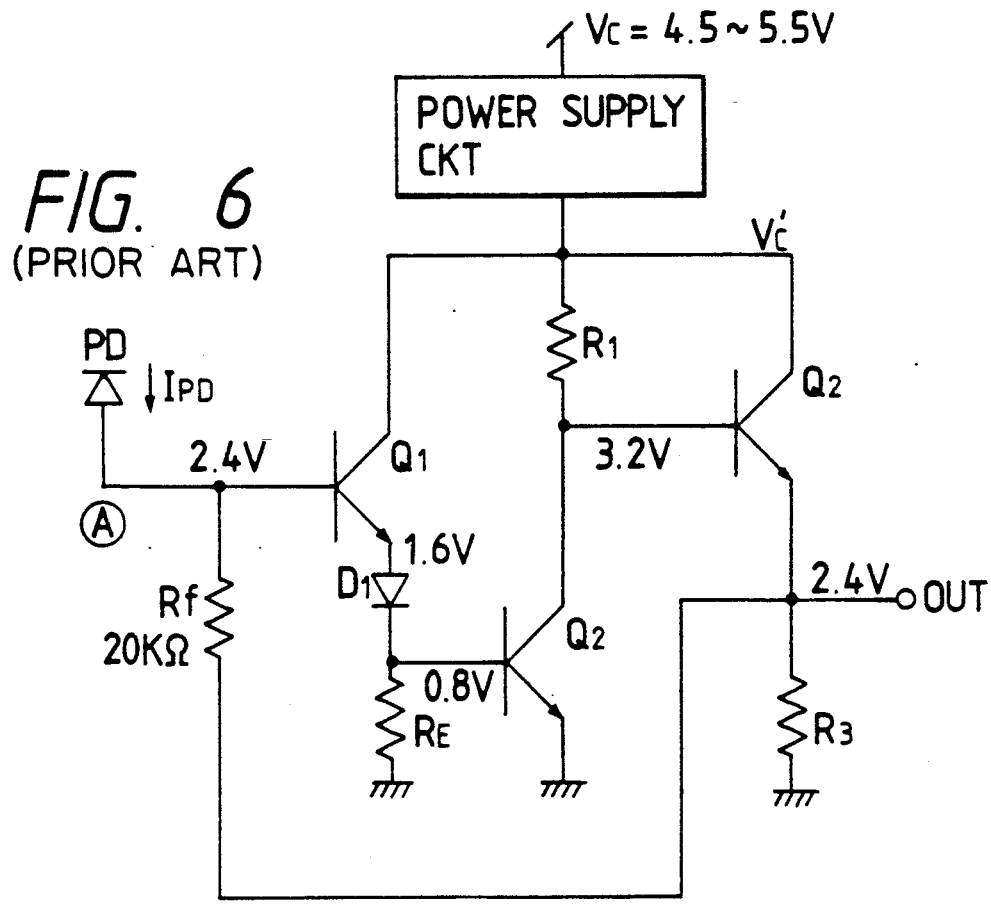
FIG. 6 (prior art) is a circuit diagram showing a conventional example.

FIG. 6 (prior art) shows a conventional example. The anode of a photodiode (PD) whose cathode is biased is connected to the base of transistor $Q_1$. The emitter of $Q_1$ is coupled to a level shift diode $D_1$, the base of $Q_2$, and a resistor $R_E$ and the resistance $R_E$ is connected to ground. The emitter of $Q_2$ is grounded and its collector is connected to $V_c'$ through its base and a resistor $R_1$. The collectors of $Q_1$ and $Q_3$ are connected to a regulated power supply $V_c'$ provided by a regulated power supply circuit processing its input $V_c$. The emitter of $Q_3$ is connected to an output terminal, grounded through a resistor $R_3$, and coupled to the base of $Q_1$ through a feedback resistor $R_f$. Normally, $V_c'$ is about 3.5 V when $V_c=4.5$ to 5.5 V. Let us now define the maximum allowable value $I_{PD.MAX}$ of the current $I_{PD}$ flowing through the photodiode PD and the bandwidth $f_c$, which is given by the following equation as previously described.

$$f_c = \frac{A+1}{2\pi RC}$$

If C=3 pF and R=20 K$\Omega$, then the bandwidth becomes $$A = \frac{1}{v_T}\{V_c' - 4\ V_{BE}\}\ f_c = 33\ \text{MHz}$$

If the bandwidth to be obtained is about 50 MHz, the bandwidth $f_c$ must be increased at the sacrifice of the noise characteristic (reducing R). If it is otherwise possible that the transistor $Q_2$ can operate at high frequencies up to $V_{CE}=1.0$ V, the maximum allowable input will be about $$I_{PD.MAX} = \frac{3.2\ V - 1.0\ V}{20\ K\Omega} = 110\ \mu A$$

The operation of the circuit shown in FIG. 6 will be described.

In FIG. 6, in order to make the maximum input current larger than that of the embodiment shown in FIG. 3, an emitter follower is provided before the amplification stage. If the ac component of the base of $Q_2$ is $v_o$, and the ac component of the base of $Q_2$ is $v_i$, the following can be obtained since the voltage gain of the emitter follower is substantially 1.

$$\frac{v_1}{v_0} = 1$$

Thus, the operation is the same as that of the embodiment shown in FIG. 3.

Figure 7:
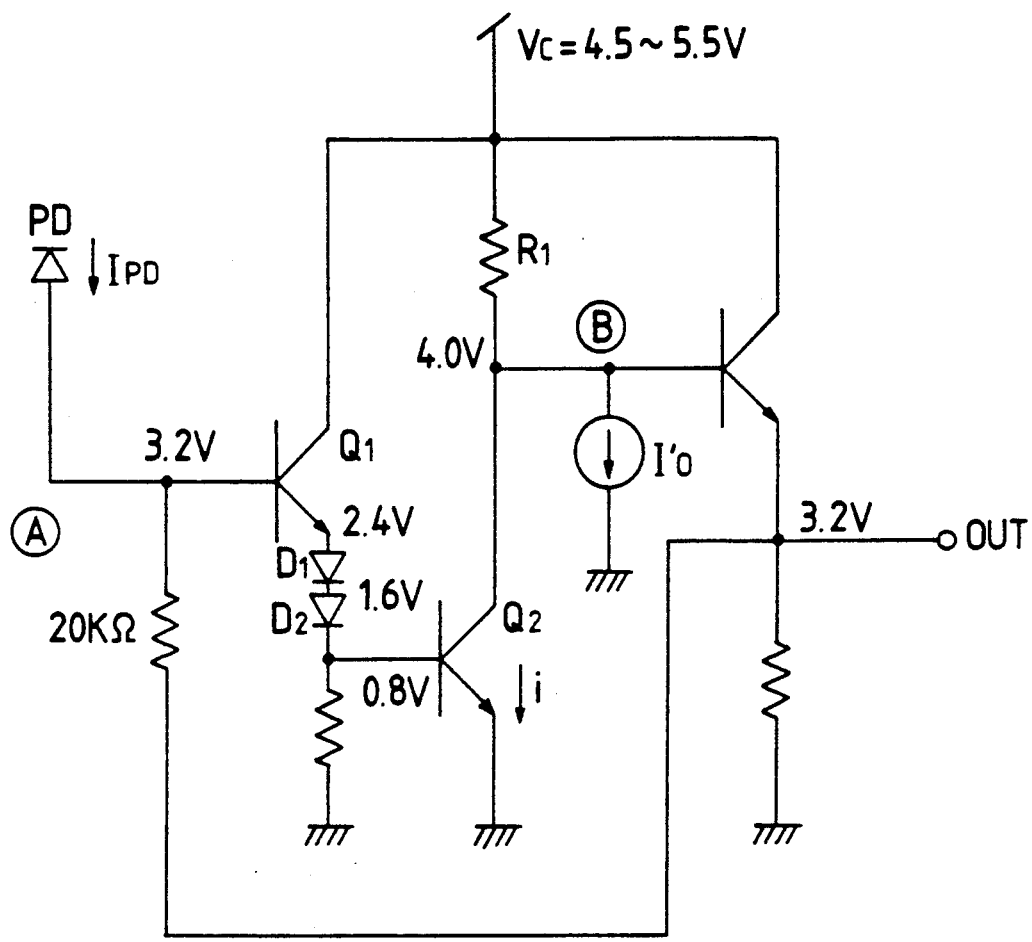
FIG. 7 is a circuit diagram according to the present invention, which is compared with the circuit of FIG. 6.

On the other hand, FIG. 7 shows an embodiment according to this invention. The embodiment of FIG. 7 differs from the embodiment of FIG. 6 in that the current supply $I_o'$ is connected to the collector of $Q_2$; the collectors of $Q_1$ and $Q_3$ and the resistor $R_1$ are connected directly to the power supply $V_c$; and a diode $D_2$ is additionally inserted in series with the level shift diode $D_1$ because the power supply voltage to be applied to the amplifier is high. In this case, $$A = \frac{1}{v_T}\{4.5\ V - 5\ V_{BE}\}$$

$$f_c = \frac{A+1}{2\pi RC} = 54\ \text{MHz}$$

thus a bandwidth $f_c$ more adequate than that of the conventional system can be obtained. Since $$I_{PD.MAX} = \frac{40\ V - 1.0\ V}{20\ K\Omega} = 150\ \mu A$$

the maximum allowable current is also more adequate than that of the conventional system shown in FIG. 6.

Thus, this system allows the application of high power supply voltages to the amplifier, thereby providing advantages in design.

As described in the foregoing pages, a simple construction achieved with an additional current supply makes it possible to maintain the gain constant even with respect to variations in power supply voltage and external environment. This allows other applications (e.g., photodetector) of the invention at low costs.

What is claimed is:

1. A gain stabilizing amplifier comprising:
    an amplifier circuit comprising first and second transistors, a base of said first transistor receiving an input signal of said gain stabilizing amplifier and an emitter of said second transistor providing an output of said gain stabilizing amplifier; and
    a variable current supply coupled so as to supply current to an emitter-collector path of said first transistor, said variable current supply providing current to compensate for variations in a bias current of said first transistor.

2. A gain stabilizing amplifier as in claim 1, wherein said input signal comprises an ac voltage.

3. A gain stabilizing amplifier as in claim 1, further comprising;
    a photodiode coupled to said base of said first transistor, said photodiode producing, as said input signals, a photoelectric current in accordance with a light signal; and
    a resistor coupling said emitter of said second transistor to said base of said first transistor.

4. A gain stabilizing amplifier as in claim 1, further comprising a resistor inserted between said emitter-collector path of said first transistor and said variable current supply.

5. A gain stabilizing amplifier as in claim 1, wherein said variable current supply is coupled to said emitter of said first transistor.

6. A gain stabilizing amplifier as in claim 1, wherein said variable current supply is coupled to said collector of said first transistor.

7. A gain stabilizing amplifier as in claim 1, wherein said variable current supply is coupled to said collector of said first transistor, said gain stabilizing circuit further comprising:

a third transistor wherein an emitter of said third transistor is coupled to said base of said first transistor;

a photodiode coupled to said base of said third transistor, said photodiode producing, as said input signals, a photoelectric current in accordance with a light signal; and a resistor coupling said emitter of said second transistor to said base of said third transistor.

* * * * *